(12) United States Patent
Togami et al.

(10) Patent No.: US 7,245,498 B2
(45) Date of Patent: Jul. 17, 2007

(54) MULTI-BOARD OPTICAL TRANCEIVER

(75) Inventors: Chris K. Togami, San Jose, CA (US); Stephan C. Burdick, Cupertino, CA (US); Stephen C. Gordy, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/093,647

(22) Filed: Mar. 30, 2005

(65) Prior Publication Data

US 2005/0168963 A1 Aug. 4, 2005

Related U.S. Application Data

(62) Division of application No. 10/286,139, filed on Oct. 31, 2002.

(51) Int. Cl.
*H05K 9/00* (2006.01)
*H05K 7/04* (2006.01)

(52) U.S. Cl. ............ 361/753; 361/728; 361/730; 361/752; 361/800; 361/799; 385/92; 174/350

(58) Field of Classification Search ........ 361/747, 361/759, 732, 740, 728, 729, 730, 752, 753, 361/799, 800; 350/96.2, 227, 96.15; 385/88, 385/92; 174/350
See application file for complete search history.

(56) References Cited

U.S. PATENT DOCUMENTS

| 5,011,246 | A | * | 4/1991 | Corradetti et al. ............ 385/92 |
|---|---|---|---|---|
| 5,117,476 | A | * | 5/1992 | Yingst et al. ................. 385/88 |
| 5,202,943 | A | * | 4/1993 | Carden et al. ................. 385/92 |
| 5,337,396 | A | * | 8/1994 | Chen et al. .................... 385/92 |
| 5,416,668 | A | * | 5/1995 | Benzoni ...................... 361/816 |
| 5,434,747 | A | * | 7/1995 | Shibata ........................ 361/753 |
| 5,535,034 | A | | 7/1996 | Taniguchi |
| 5,618,188 | A | | 4/1997 | Gilmore et al. |
| 6,200,041 | B1 | | 3/2001 | Gaio et al. |
| 6,213,651 | B1 | * | 4/2001 | Jiang et al. ................... 385/92 |
| 6,239,427 | B1 | * | 5/2001 | Mizue ......................... 250/239 |
| 6,358,066 | B1 | * | 3/2002 | Gilliland et al. ............ 439/76.1 |
| 6,461,058 | B1 | * | 10/2002 | Birch et al. ................... 385/92 |
| 6,499,890 | B2 | * | 12/2002 | Gilliland et al. .............. 385/88 |
| 6,530,699 | B1 | * | 3/2003 | Gilliland et al. .............. 385/88 |
| 6,540,412 | B2 | | 4/2003 | Yonemura et al. |
| 6,652,161 | B2 | | 11/2003 | Grann et al. |
| 6,863,448 | B2 | * | 3/2005 | Chiu et al. .................... 385/88 |
| 6,974,263 | B2 | * | 12/2005 | Sato et al. .................... 385/88 |
| 7,130,194 | B2 | * | 10/2006 | Togami et al. ............... 361/715 |
| 2003/0091349 | A1 | * | 5/2003 | Sato et al. ................... 398/135 |
| 2004/0212974 | A1 | * | 10/2004 | Ice et al. ..................... 361/801 |
| 2005/0168957 | A1 | * | 8/2005 | Kawauchi et al. .......... 361/749 |

* cited by examiner

*Primary Examiner*—Dean A. Reichard
*Assistant Examiner*—Dameon E. Levi
(74) *Attorney, Agent, or Firm*—Workman Nydegger

(57) ABSTRACT

An optical transceiver module that includes an enclosure within which are disposed a transmitter module and a receiver module. A primary and secondary board are disposed as well in the enclosure, and the transmitter module and the receiver module are each connected with one of the boards. The primary and secondary boards each have a ground plane, and a third ground plane is provided by a ground signal plate that disposed within the enclosure and electrically coupled with the primary board and the secondary board.

17 Claims, 16 Drawing Sheets

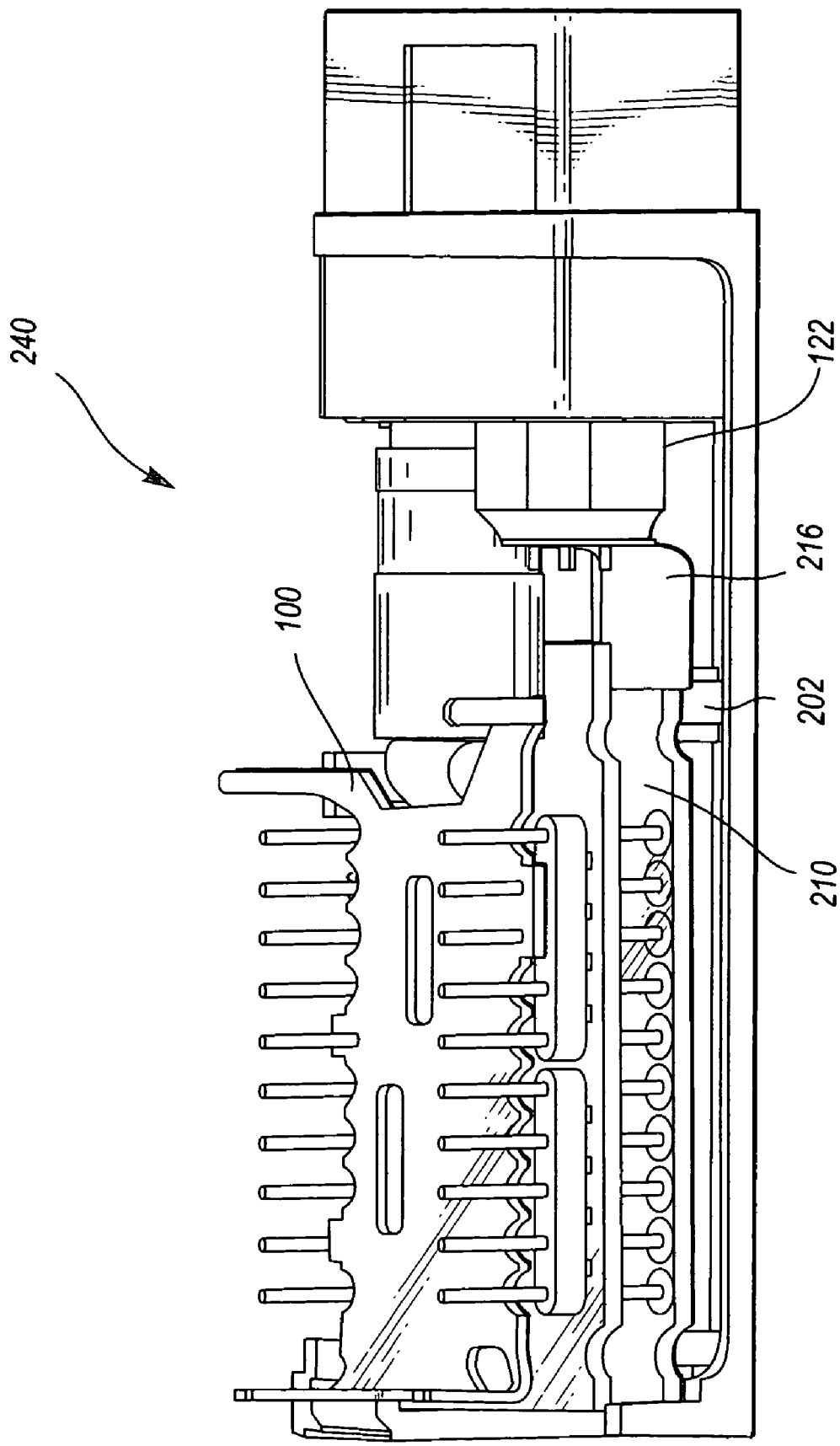

MULTI-BOARD OPTICAL TRANCEIVER

CROSS-REFERENCE TO RELATED APPLICATIONS

This application is a divisional, and claims the benefit, of U.S. patent application Ser. No. 10/286,139, entitled MULTI-BOARD OPTICAL TRANSCEIVER, filed Oct. 31, 2002, and incorporated herein in its entirety by this reference.

BACKGROUND

The invention relates generally to optoelectronic/optical transceivers and particularly to optoelectronic/optical transceiver modules that benefit from an efficient use of module space.

Today, communication systems using optical fiber as a means for transmission are widely employed for a variety of purposes ranging from a basic transmission line in public communication channel to a short-distance network such as a LAN (local area network). Since most of the devices connected by these optical fibers are electronic devices rather than optical devices, optical transceivers are commonly placed at the interface between the optical fibers and the electronic devices. An optical transceiver includes an optical transmitter that receives electric signals and converts them into optical signals, and an optical receiver that receives optical signals and converts them into electric signals.

Optical transceivers are commonly packaged in the form of a transceiver module that can be mounted on a motherboard of one of the electronic devices. These electronic devices to which an optical transceiver may be attached are commonly referred to as "host devices." As optical transceivers become more prolific, standards are imposed so that manufacturers of host devices do not have to custom-order transceivers. Unfortunately, these standards ultimately become constraints that conflict with the transceiver designs that call for bigger optical transceiver modules. For example, while a size standard imposes a maximum allowable size of a transceiver module, certain components in the optical transceiver module must be placed far apart in order to reduce crosstalk and electromagnetic interference. More specifically, the transmitter and the receiver should be spaced far apart and shielded from each other because the optical transmitter, which requires a relatively high current for modulation of a light emitting element (e.g., a laser diode), can interfere with the optical receiver which operates with a relatively low current obtained from the light receiving element. Also, to ensure that electrostatic discharge effects will not be significant, it is desirable to place the components away from the housing of the optical transceiver module. However, doing so increases the size of the printed circuit board inside the module since the edges of the printed circuit boards cannot be utilized and conflicts with the size restriction imposed by the standard.

One attempt to meet the size restriction while separating certain components by a minimum distance involves coupling the transmitter and the receiver to two different sides of a single printed circuit board. FIGS. 1–5 show an exemplary embodiment of a conventional single-board transceiver 30 including a transmitter module 32 (e.g., TOSA) and a receiver module 34 (e.g., ROSA) mounted on one printed circuit board (pcb) 36 that is configured to fit inside a standard transceiver module housing. If pcb 36 is a double-sided printed circuit board, the receiver module 34 and the receiver circuitry may be mounted on one surface of printed circuit board 36, while the transmitter module 32 and the transmitter circuitry may be mounted on the other surface of the printed circuit board. Connector pins 39 are soldered on to pcb 36, as shown in FIG. 2. The connector pins 39 should be arranged to meet the configuration imposed by the relevant optical communication standard. Then, as shown by an arrow in FIG. 3, the transceiver 30 with connector pins 39 is placed in a lower housing 40, which is designed to meet the standard size restrictions. The lower housing 40 comprises a base 42, sidewalls 44, and a network interface enclosure 46. The network interface enclosure 46 is divided into a first section 48 for housing the transmitter 32 and a second section 49 for housing the receiver 34. The division of the network interface enclosure 46 into two sections helps reduce crosstalk between the transmitter 32 and the receiver 34 because the lower housing 40 is made of a shielding material. FIG. 4 shows a transceiver module 50, which is a combination of the transceiver 30 and the lower housing 40. When an upper housing 52 is disposed to cover the lower housing 40, the result is the completely enclosed transceiver module 50, as depicted in FIG. 5. The upper housing 52 is designed to snugly fit around the sidewalls 44 of lower housing 40, and have slots through which pins 39 can protrude and be coupled to a host device.

However, the single-board optical transceiver module 50 has disadvantages. Where the transmitter 32 and the receiver 34 are coupled to different surfaces of the pcb 36, for example, two controllers (one on each surface) may be necessary to control both components, raising the cost of the transceiver and wasting valuable board surface. Further, since the transmitting circuit is greater in circuit scale than the receiving circuit, the size of the printed circuit board is, to an extent, determined depending on the circuit scale of the transmitting circuit. Consequently, a sufficient margin space is left on the surface of the printed circuit board where the receiving circuit is to be disposed, again leading to a waste of valuable board space. As host devices operate at higher performance levels with faster data transfer rates, it becomes desirable to squeeze more circuitry into an optical transceiver module. In light of this increased need to efficiently use the volume of the transceiver module, such waste of the board space becomes highly undesirable. A transceiver configuration that allows a more efficient use of space for higher circuit density is desirable.

SUMMARY OF AN EXEMPLARY EMBODIMENT OF THE INVENTION

A transceiver module including a primary printed circuit board and a secondary printed circuit board in an enclosure is presented. The primary printed circuit board is coupled to the secondary printed circuit board by a connector pin that protrudes out of a critical surface of the enclosure. The printed circuit boards may be positioned substantially parallel to the critical surface of the enclosure. When a transmitter is electrically connected to the primary printed circuit board and a receiver is electrically connected to the secondary printed circuit board, the transmitter and the receiver may be positioned in a plane that is also substantially parallel to the plane of the critical surface.

BRIEF DESCRIPTION OF THE DRAWINGS

FIG. 19 depicts a partially-enclosed transceiver module in accordance with the second embodiment of the invention.

DETAILED DESCRIPTION OF EXEMPLARY EMBODIMENTS OF THE INVENTION

The present invention is directed to an optical transceiver module, and it will be described in that context. As used herein, a "transceiver" refers to components and circuitry necessary for converting signals between optical and electrical modes. A "transceiver module" refers to a transceiver combined with some type of housing or enclosure. Also, as used herein, the words "up," "top," and "above" and the words "down," "bottom," and "below" are used in reference to a transceiver or a transceiver module whose base is resting on a surface.

Figure 6A:
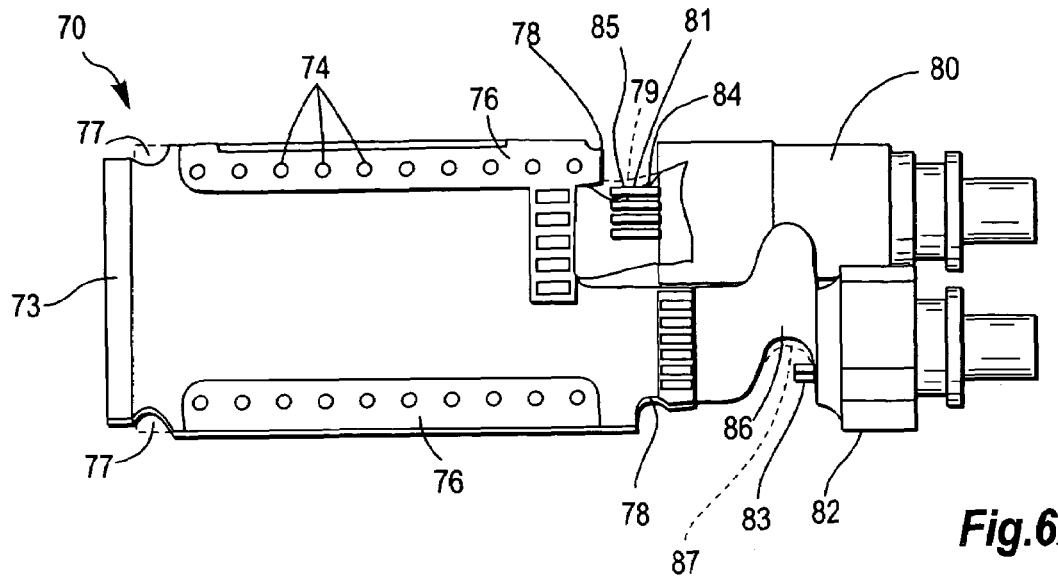
FIG. 6A depicts a primary board coupled to a transmitter module and a receiver module that is to be used for a first embodiment of the invention.

FIG. 6A depicts a primary board 70, which is a printed circuit board with a signal ground plane that may have components and circuitry on at least one surface and through-holes 74 along the edges. The primary board 70 has conductive zones 76 in select sections of the board surfaces including the area around the through-holes 74 and along an edge that is closest to a transmitter module 80 and a receiver module 82. Each of the conductive zones 76 along the edges include a long strip of conductive material with through-holes 74 punched through them. Therefore, the through-holes 74 are electrically coupled to each other by the conductive zones 76, and the circuitry that are connected to each of the through-holes 74 are automatically connected to each other.

The conductive zones 76 of the primary board 70 are directly electrically connected to the transmitter module 80 and the receiver module 82 with a conductive means, e.g., flexible connectors 84 and 86. The transmitter module (e.g., TOSA) 80 is a well-known device that includes a transmitter (e.g., a laser diode) for receiving electrical signals and emitting optical signals. The receiver module 82 is a well-known device that includes a component (e.g., a photodiode) for receiving optical signals and generating corresponding electrical signals. The connectors 84 and 86 may be any well-known connection devices, and may include circuitry. Although other means of connection may be used to electrically couple the transmitter module 80 and the receiver module 82, connectors 84 and 86 are preferably flexible connectors because flexible connectors fit into a small space, include necessary circuitry, allow for short leads 81, 83 from the transmitter and receiver modules 80, 82, and have easily adjustable shapes. Since the connectors 84 and 86 need to fit into a small and crowded space, portions of the flexible connectors are cut out to prevent them from occupying the space that would be needed for another component of the transceiver module. The connectors 84 and 86 may have different sizes and shapes, as each of them accommodates different components in its surrounding. For example, the flexible connector 84 is shaped with a cutout 85 to accommodate a structure in the enclosure and the flexible connector 86 is shaped with a different cutout 87 that accommodates a mounting stud connected to the enclosure (shown below in FIG. 14). A person of ordinary skill in the art would understand how to use a flexible connector to electrically couple the transmitter module and the receiver module to the conductive zones 76.

The shape of the primary board 70 is approximately a rectangular board with cutout corners 77, side cutouts 78, and a transmitter cutout 79. The cutout corners 77 and the side cutouts 78 accommodate certain parts of the enclosure in which the boards are placed, which is shown below. The transmitter cutout 79 is necessary to make space for the transmitter module 80, which is larger than the receiver module 82. The primary board 70 also has an extension 73 on the side of the board opposite the side that is connected to the transmitter module 80 and the receiver module 82. The extension 73 is a part of the printed circuit board with no circuitry or components, and helps prevent the primary board 70 from shifting inside the enclosure after the primary board 70 is assembled into a transceiver module, as explained below in reference to FIG. 12. The area of the primary board 70 near the extension 73 may include "kee-pouts" or regions where components are not to be placed.

Figure 6B:
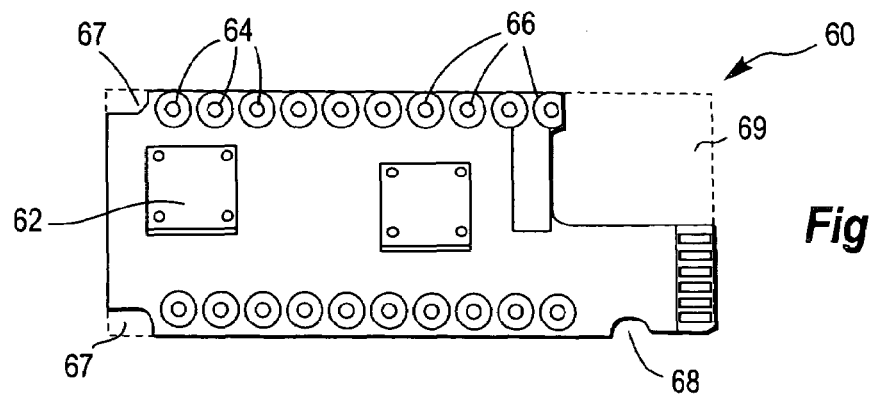
FIG. 6B depicts a secondary board that is to be used for a first embodiment of the invention.

FIG. 6B depicts a secondary board 60, which is a printed circuit board that has circuitry on at least one surface and through-holes 64 located along two edges. The through-holes 64 of the secondary board 60 are positioned to match the positions of the through-holes 74 on the secondary board 60 so that straight pins can connect the two boards. The secondary board 60 includes a signal ground plane and has conductive zones 66 coated with a conductive material. Each of the conductive zones 66 are selectively connected to certain parts of the circuitry on the surface of the secondary board 60. The circuitry may include components, such as a component 62, that emit electromagnetic radiation and heat. The conductive zones 66 surround each of the through-holes 64 without all being connected to each other. Thus, the circuitry on the secondary board 60 can be selectively coupled to another circuit that is not on the secondary board 60 through a conductive pin that is inserted into one of the through-holes 64. The separation of the conductive zones 66 around each of the through-holes 64 prevents the circuits that are connected to each of the through-holes 64 from automatically connecting to one another when conductive pins are inserted into the through-holes 64. There are also conductive zones 66 near the edge that would be closest to the transmitter module 80 and a receiver module 82 when the transceiver is assembled. Like the primary board 70, the secondary board 60 has cutout portions such as corner cutouts 67, a side cutout 68, and a transmitter cutout 69. The purpose of these cutout portions is to accommodate certain protruding portions of the enclosure in which the secondary board 60 will be placed. A person of ordinary skill in the art would know how to achieve the desired shape for the secondary board 60 from a standard rectangular-shaped printed circuit board.

Figure 7:
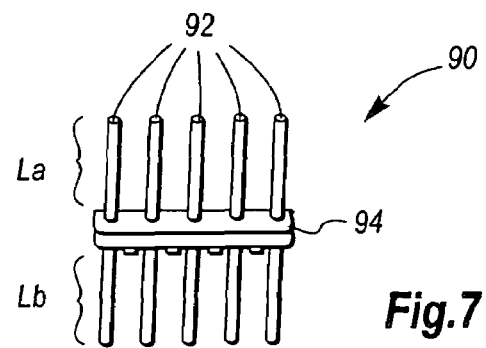
FIG. 7 depicts an exemplary pin device that may be used to couple a plurality of boards in accordance with the invention.
Figure 8:
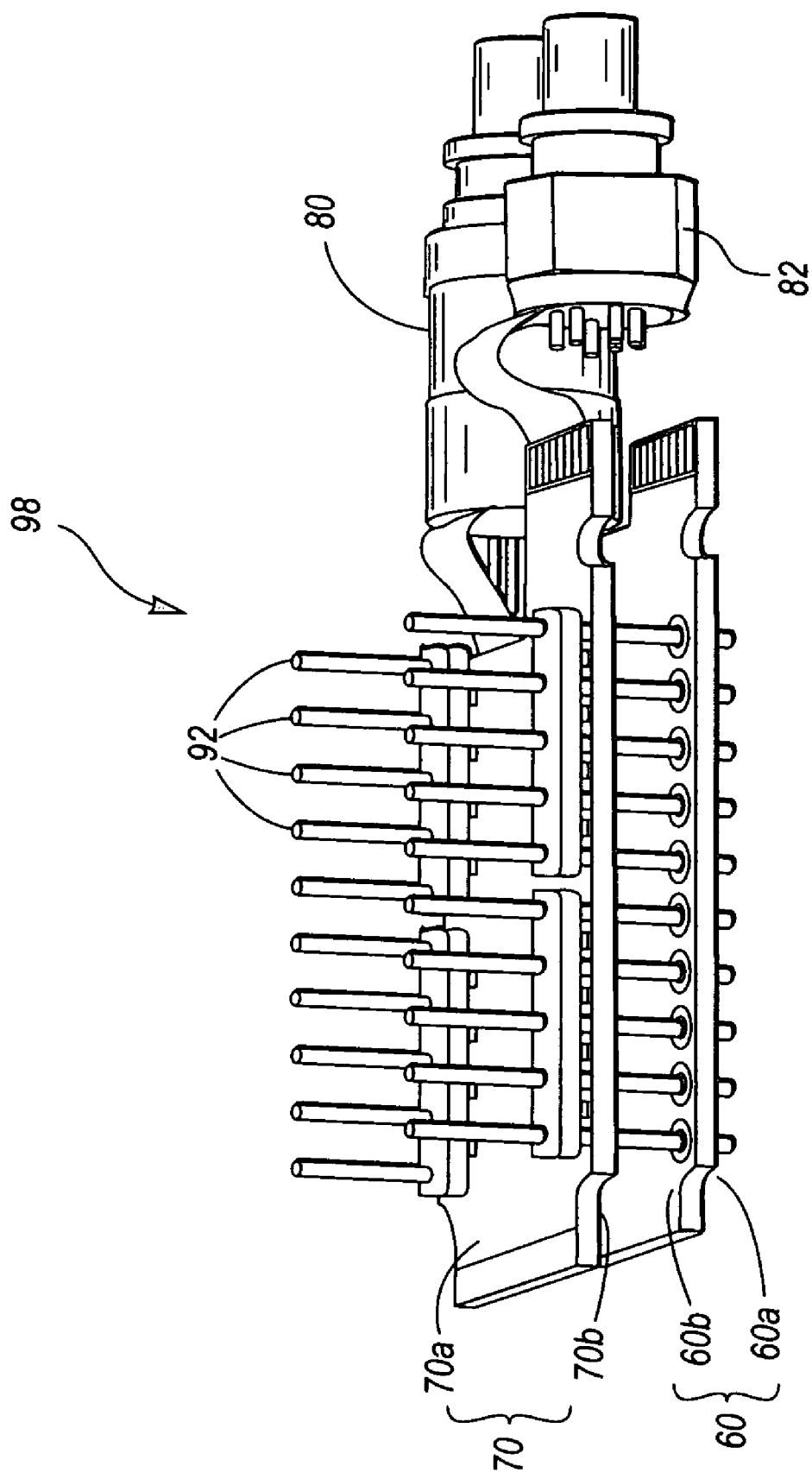
FIG. 8 depicts the primary board of FIG. 6A and the secondary board of FIG. 6B combined with the pin device of FIG. 7 to form a transceiver in accordance with the first embodiment of the invention.

FIG. 7 depicts an exemplary pin device 90 that is used for connecting the secondary board 60 and the primary board 70. The pin device 90 includes a set of connector pins 92 and a header 94 that holds them together at fixed locations. The connector pins 92 are made of a conductive material and sized to fit snugly through the through-holes 64 of the secondary board 60 and the through-through-holes 74 of the primary board 70. The connector pins 92 are long enough to extend through both the secondary board 60 and the primary board 70 and through a critical surface of an enclosure (not shown in this figure) so that they can couple to a host device. The header 94 divides the length of each connector pin 92 into two sections: an upper pin portion having a length $L_a$ and a lower pin portion having a length $L_b$. In the preferred embodiment, the connector pins 90 have a straight section that is long enough to couple the secondary board 60 and the primary board 70 and protrude through a surface of the enclosure. Although this exemplary embodiment shows a set of five connector pins 92 in the pin device, 90, the invention is not so limited and the pin device 90 may include any number of connector pins. The preferred number of pins in a pin device 90 depends at least partly on a standard pin layout that is imposed on transceiver modules. In a 20-pin transceiver module that has 10 pins on each side, a part of which is shown in FIG. 8, it is preferable to have 5 or 10 pins per pin device 90. The header 94, which separates two parts within a transceiver module, may be made of any nonconductive material that is solid enough to provide structural integrity to the transceiver. The header 94 is made of a solid, electrically nonconductive material (e.g., plastic).

FIG. 8 depicts how the secondary board 60 and the primary board 70 are connected with the pin device 90 to form a multi-board transceiver 98. Four of the 5-pin pin device 90 are used to completely connect the secondary board 60 and the primary board 70 in a 20-pin transceiver module. Preferably, the multi-board transceiver 98 is formed by first inserting four of the pin devices 90 through the through-holes 74 (FIG. 6A) of the primary board 70 until the header 94 contacts the primary board 70, then inserting the lower portion of connector pins 92 having a length $L_b$ through the through-holes 64 of the secondary board 60 and soldering the connector pins 92 onto the through-holes 64. Either the header 94 or the upper portion ($L_a$) of the connector pins 92 are soldered on to the primary board 70 to provide structural rigidity to the transceiver 98 and to prevent the two boards from collapsing onto each other. The connector pins 92 establish electrical connection between the primary board 70 and the secondary board 60. The extent to which the connector pins 92 go into the through-holes is set by the location of the header 94, which lodges on the top surface of the primary board 70 after a predetermined length of the connector pins 92 extend through the holes.

Once the primary board 70 and the secondary board 60 are assembled into the transceiver 98 with connector pins 92, the four board surfaces are referred to as a primary exterior surface 70a, a primary interior surface 70b, a secondary interior surface 60b, and a secondary exterior surface 60a. One or both of the primary board 70 and secondary board 60 may be double-sided, providing up to four surfaces on which components and circuits can be placed. A person of ordinary skill in the art will understand that components and circuits may be divided among the four surfaces in a number of ways to optimize the performance of the transceiver 98. For example, in one embodiment, the components and circuits that operate the transmitter module 80 may be placed on one board while the components and circuits that operate the receiver may be placed on the other board. Separation of the transmitter components and the receiver components helps reduce crosstalk between the components for each module. In addition, electromagnetic interference may be minimized by placing the noisiest components and the most noise-sensitive components as far apart as possible, for example on the primary exterior surface 70a and the secondary exterior surface 60a. This arrangement places two ground planes (one in each board) between the noisiest components and the noise-sensitive components, significantly reducing electromagnetic interference. The ground planes are formed integrally with the printed circuit boards.

Figure 9:
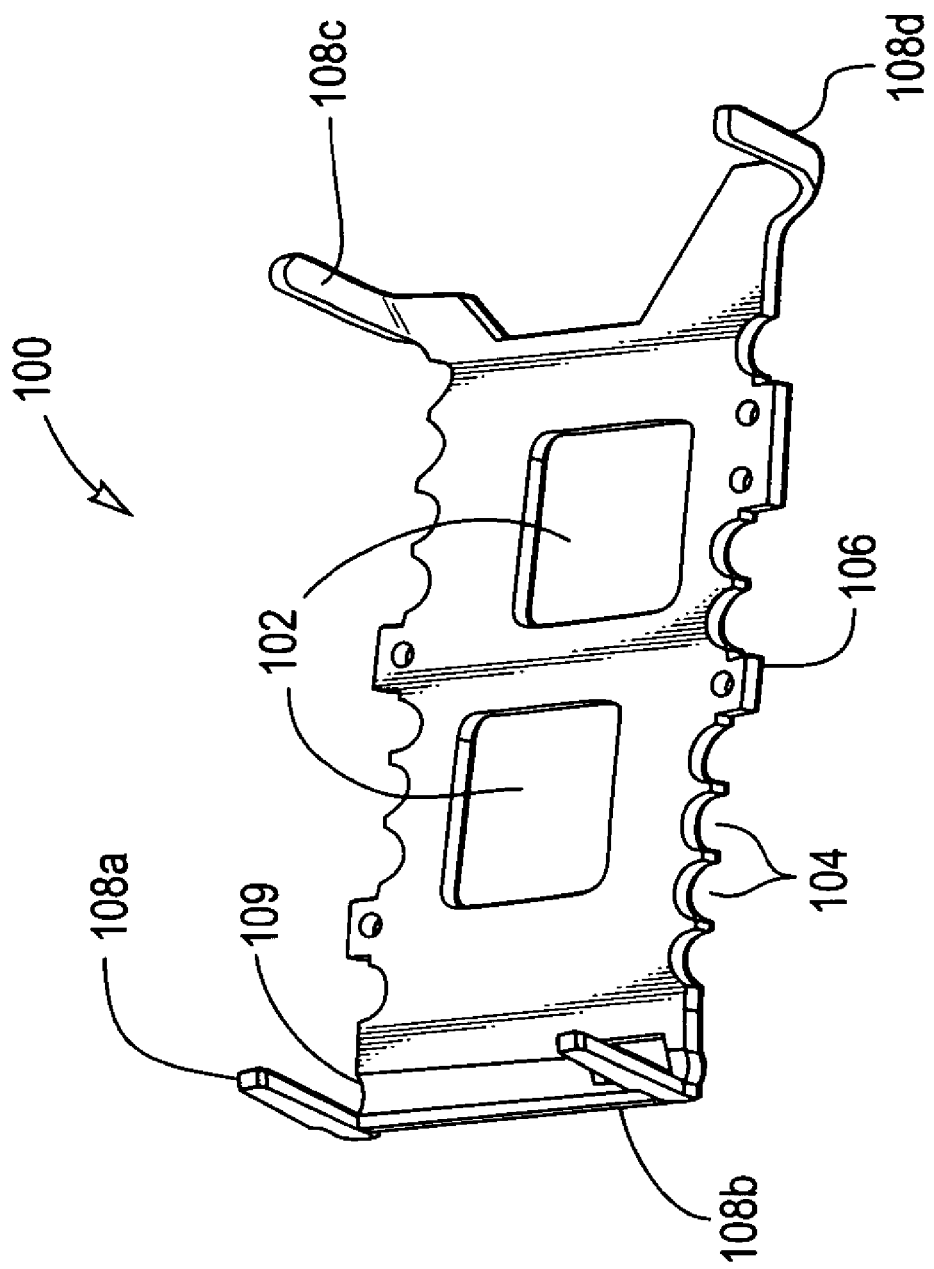
FIG. 9 depicts an optional signal ground plate that may be added to the transceiver in accordance with the invention.

FIG. 9 depicts an optional signal ground plate 100 that may be positioned near the primary board 70 to provide additional electromagnetic interference shielding. The signal ground plate 100 may be a signal ground plane that is shaped to accommodate various parts around it. For example, the signal ground plate 100 may have openings 102 designed to accommodate large/tall components attached to the top surface of the primary board 70 (this example does not show such components). The edges of the signal ground plate 100 that align with the connector pins 92 have cutouts 104 and holes that accommodate the connector pins 92. The cutouts 104 are curved portions along the edge that do not contact the connector pins 92 when assembled, while the connector pins 92 extend through the holes 106 and makes an electrical connection with the inserted connector pins 92. If the signal ground plate 100 is a signal ground plane, the connector pins 92 that extend through the holes 106 are at signal ground, as are all circuits that are connected to those connector pins 92.

The signal ground plate 100 includes four signal ground pins 108a, 108b, 108c, and 108d (collectively 108) that are designed to extend through the enclosure like the connector pins 92. The signal ground pins 108 are arranged according to the standards imposed on optical transceivers. In FIG. 9, the signal ground pins 108 are arranged at four corners of a trapezoid instead of four corners of a rectangle. More specifically, the signal ground pins 108c and 108d are arranged so that they are offset from each other instead of being directly across from each other. This trapezoidal arrangement is imposed by the MSA.

The signal ground plate 100 may be made of a rigid material that does not flex easily and effectively blocks electromagnetic interference. Thus, integrating the signal ground pins 108 into the signal ground plate 100 prevents the signal ground pins 108 from becoming displaced or bent when a force is applied. The signal ground plate 100 further includes a groove 109 located near the signal ground pins 108a and 108b. The groove 109 prevents a 90° degree angle from forming near the interface of the signal ground pins 108a, 108b and the rest of the signal ground plate 100, thereby adding extra stability to these signal ground pins. A 90° degree angle would make the signal ground pins 108a, 108b prone to breaking.

Figure 10:
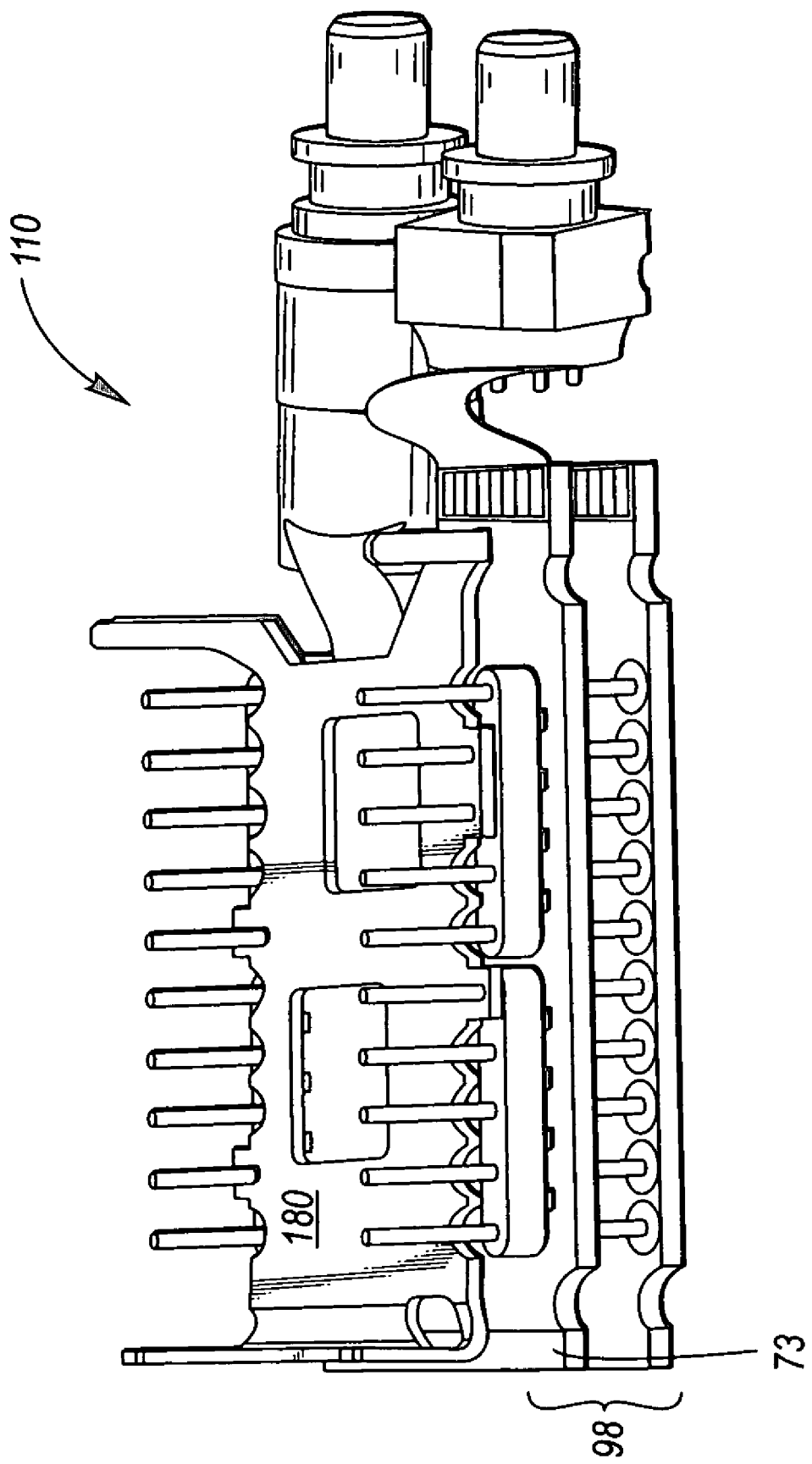
FIG. 10 depicts a multi-board transceiver including the signal ground plate of FIG. 9 in accordance with the first embodiment of the invention.

FIG. 10 depicts how the signal ground plate 100 is combined with the multi-board transceiver 98 of FIG. 8 to form a triple-ground-plate transceiver 110. The triple-ground-plate transceiver 110 includes the secondary board 60, the primary board 70, and the signal ground plate 100, each of which includes a signal ground plane. The signal ground plate 100 is placed above the primary board 70 such that parts of the cutouts 104 and the holes 106 lodge on the header 94, and is soldered to the header 94. The cutouts 104 do not contact the connector pins 92, while the connector pins 92 that extend through the holes 106 are electrically connected to the signal ground plate 100. Which connector pins 92 are to be connected to the signal ground plate 100 is predetermined by an industry standard. The signal ground pins 108 extend upward, in the same direction the connector pins 92 extend. Two of the signal ground pins 108 are located above the two ends of the extension 73 of the primary board 70. Two of the signal ground pins 108 are aligned with one row of connector pins 92, while the other two are aligned with the other row of connector pins 92.

Figure 1:
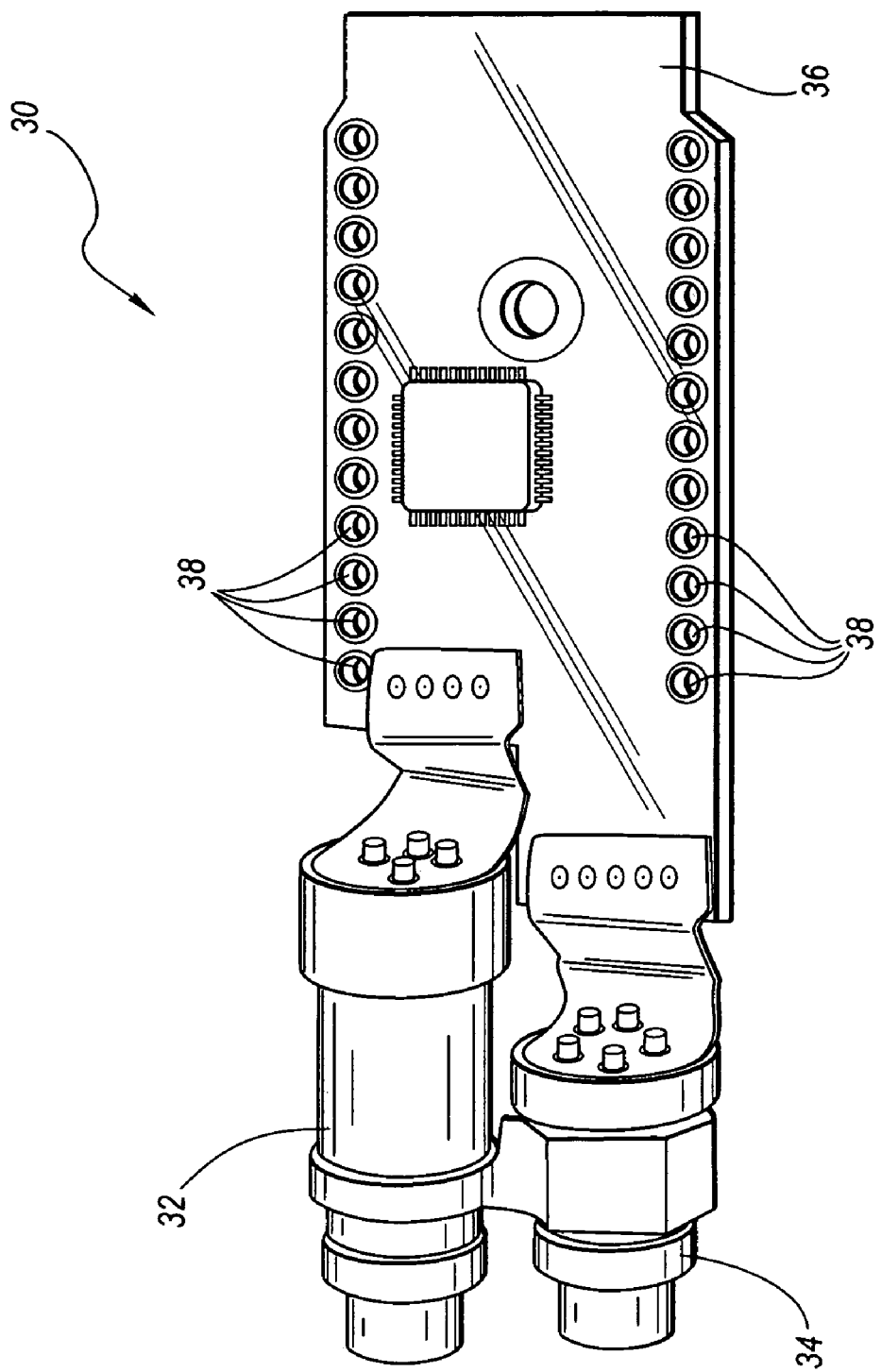
FIG. 1 depicts a conventional single-board transceiver.
Figure 2:
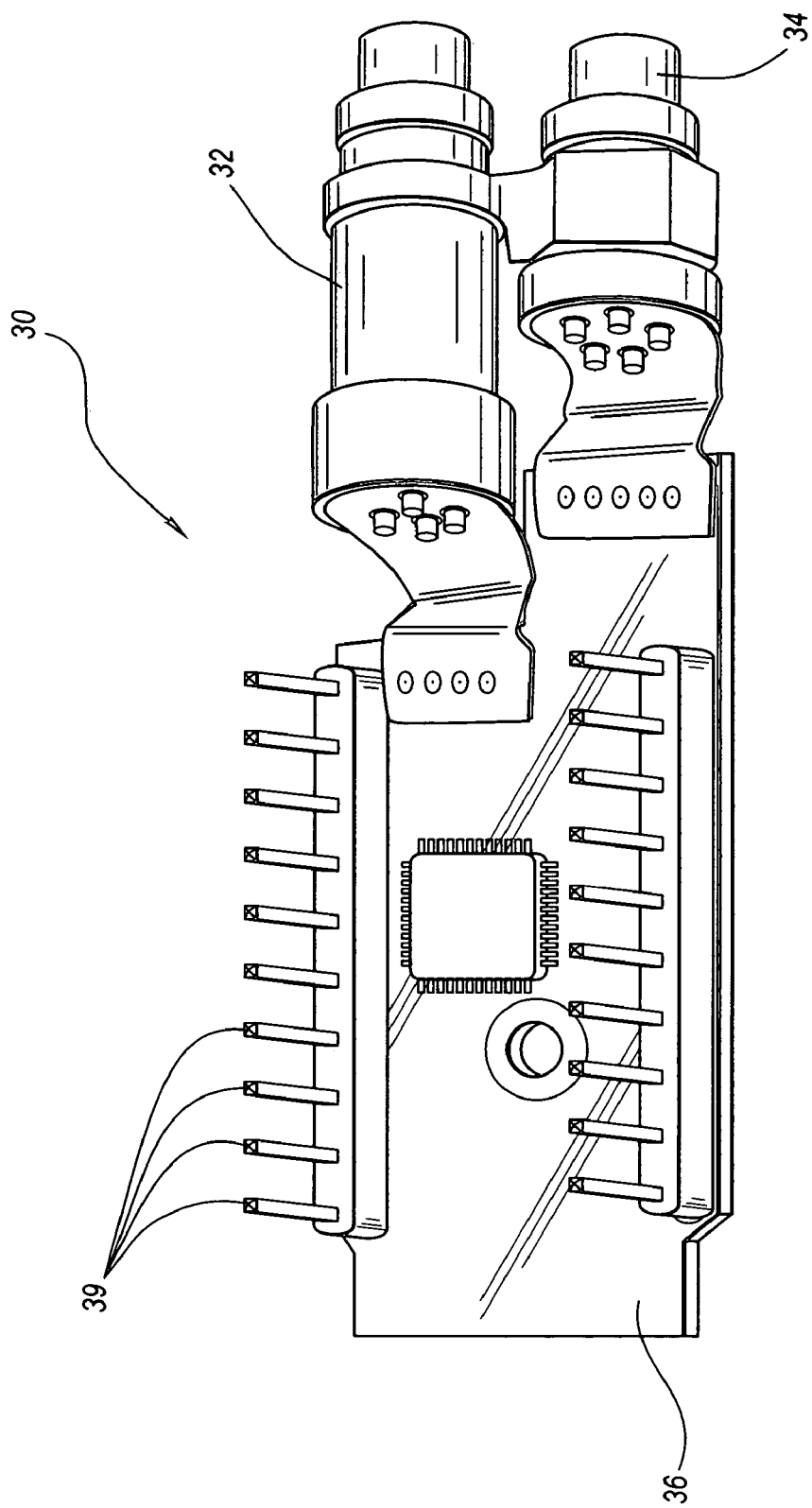
FIG. 2 depicts the single-board transceiver of FIG. 1 with pins.
Figure 3:
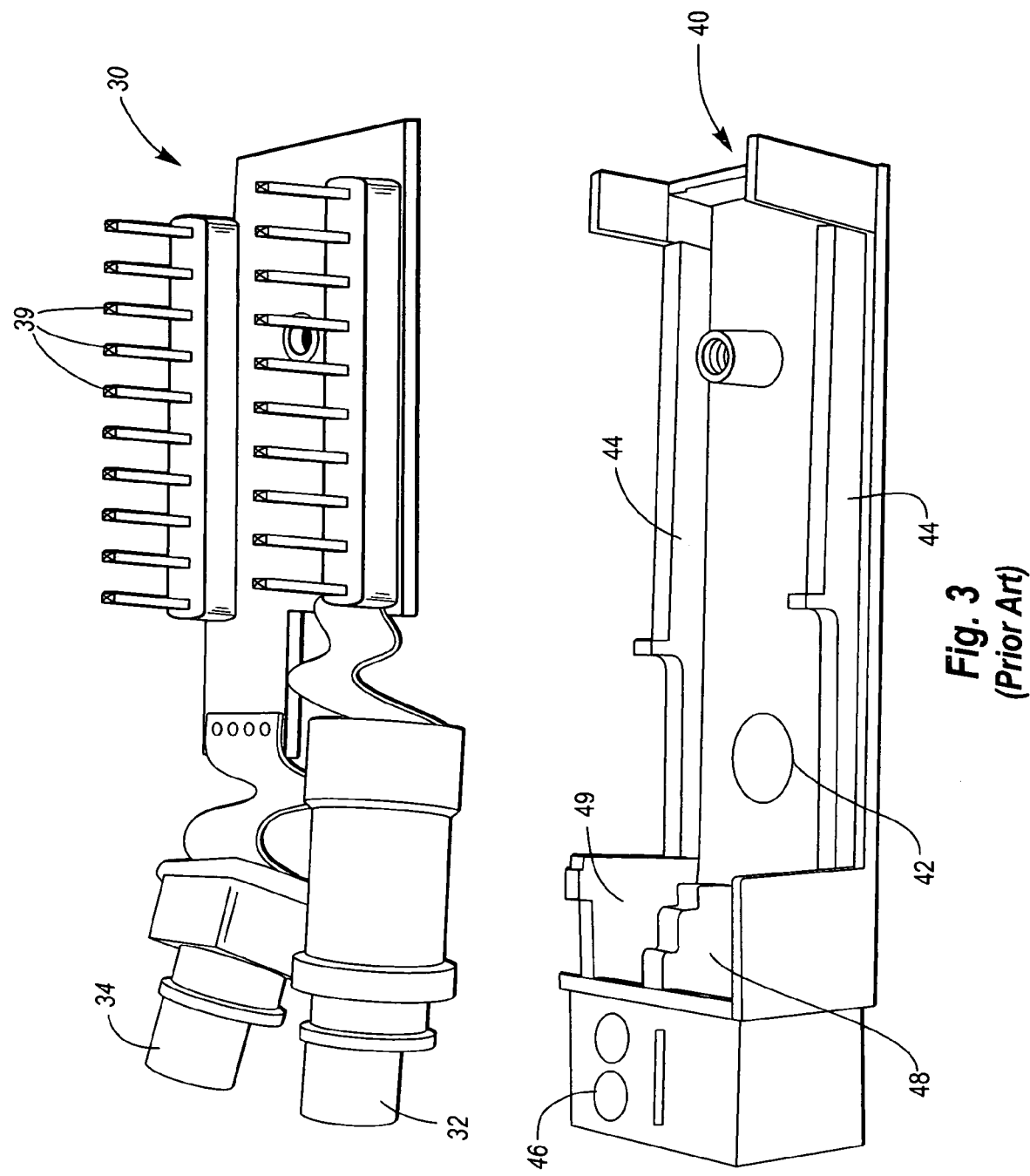
FIG. 3 depicts the transceiver of FIG. 2 and a partial housing.
Figure 4:
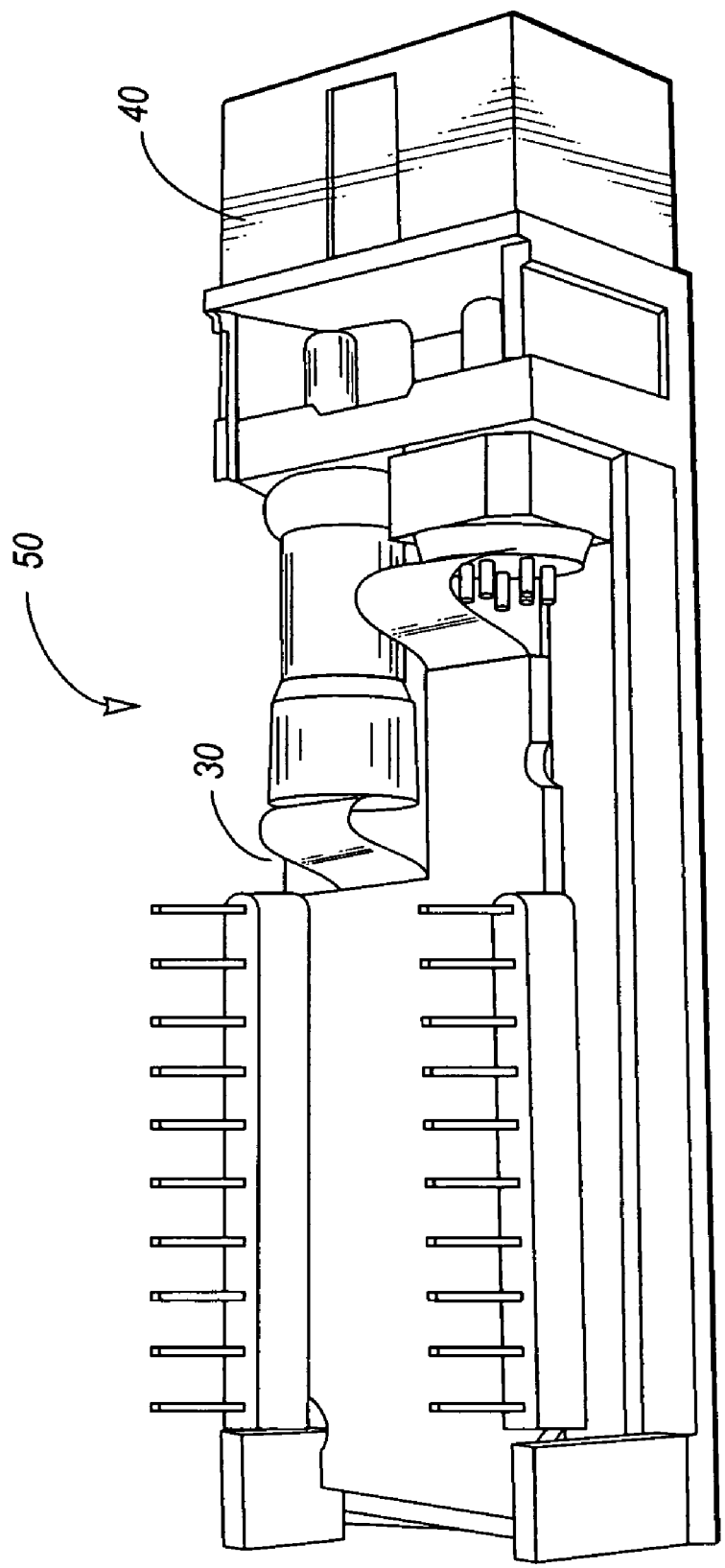
FIG. 4 depicts the transceiver of FIG. 2 placed in the partial housing of FIG. 3.
Figure 5:
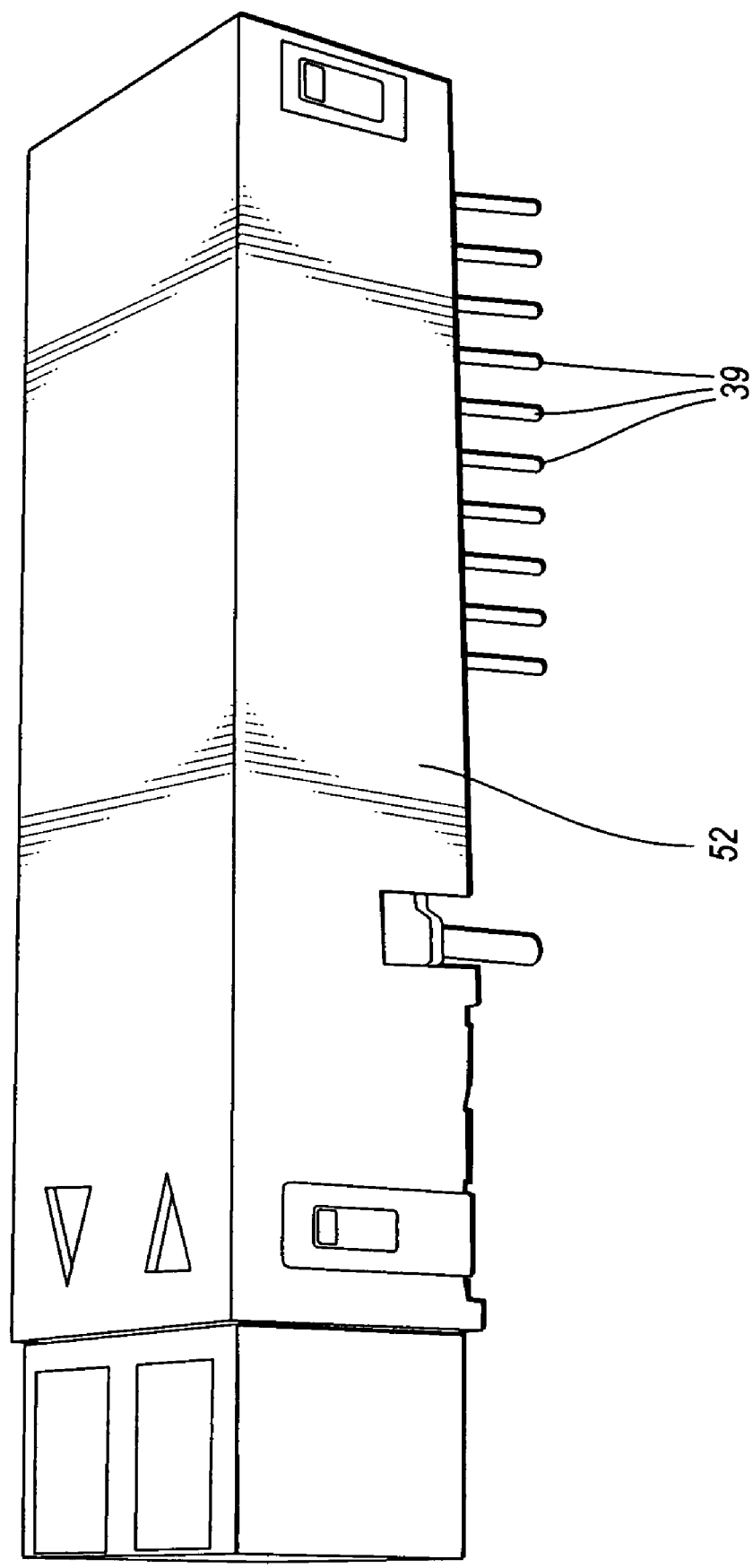
FIG. 5 depicts a conventional completely enclosed single-board transceiver module.
Figure 11:
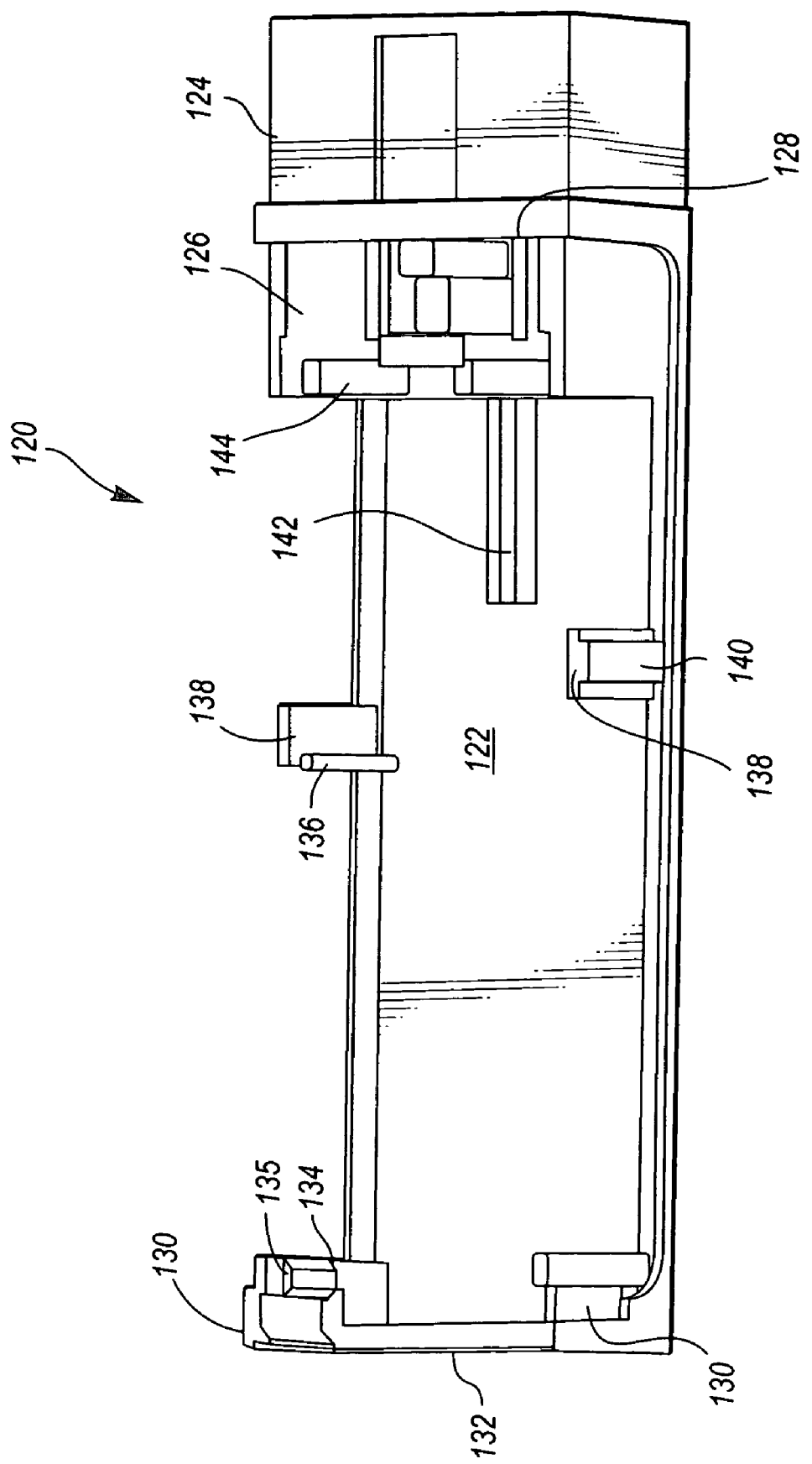
FIG. 11 depicts a lower housing for a transceiver in accordance with the invention.

FIG. 11 depicts a lower housing 120 that forms part of the enclosure for a transceiver module in accordance with the invention. The lower housing 120 has substantially the same standard dimensions as the lower housing 40 of FIG. 3, and includes a base 122 and a covered section 124. The base 122 lies on a plane that is substantially parallel to the critical surface (see FIG. 13) of the enclosure when assembled. The plane on which base 122 lies is also substantially parallel to the plane of the secondary board 60 and the plane of the primary board 70. The covered section 124 is divided into a transmitter section 126 in which an optical fiber (not shown) carrying signals output from transmitter module 80 terminates, and a receiver section 128 in which an optical fiber (not shown) carrying signals entering receiver 82 terminates. The lower housing 120 may also have corner structures 130 near the corners of the base 122 that are farthest away from the covered section 124, and the two corner structures 130 are connected with an end wall 132 that extends across the width of the base 122. The end wall 132 is designed to block electromagnetic interference by ensuring that the transceiver 98 is enclosed as completely as possible (i.e., minimize the gap through which electromagnetic interference can escape) when the transceiver module is assembled. Each of the corner structures 130 includes a lower corner shelf 134 and a higher corner shelf 135 that support the primary board 70 and the signal ground plate 100, respectively. Along the longest edge of the lower housing 120 approximately halfway down the length of the lower housing 120 is a side shelf 136 that is about as high as the lower corner shelf 134. Each side shelf 136 is connected to a side structure 138. The side shelf 136 protrudes from the side structure 138 inward, or toward the inside of the enclosure that base 122 forms a part of, effectively forming a shelf on which the primary board 70 can rest. On the outside wall of each side structure 138 is a support structure 140. The support structure 140 is to prevent the signal ground pins 108 from bending too far down, as described below in reference to FIG. 12. Protruding from the base 122 is a rib 142 that provides structural strength to the base 122 and ensures that the base 122 does not bend easily. As shown above in FIG. 8, the connector pins 92 extend beyond the bottom surface of the secondary board 60. The lower housing 120 being chassis ground, it is undesirable for the connector pins 92 to come into contact with the base 122. Therefore, the height of the rib 142 is low enough that it will not come in contact with the secondary exterior surface 60a or the bottom portions of connector pins 92. The rib 142 may be made of the same material as the base 122 or a nonconducting material.

The lower corner shelf 134 and the side shelf 136 support the primary board 70, thereby helping to keep the primary board 70 and the secondary board 60 separated. The lower corner shelf 134 and the side shelf 136 are, therefore, necessarily taller than the rib 142. Among the three planes in the transceiver 98, namely the primary board 70, the secondary board 60, and the signal ground plate 100, only the secondary board 60 is placed below the level of the end wall 132 since it does not have an extension 73 like the primary board 70. The transmitter module 80 and the receiver module 82, both of which have a cylindrical shape, are supported by the curved support structures 144 located at the interface of the base 122 and the covered section 124.

Figure 12:
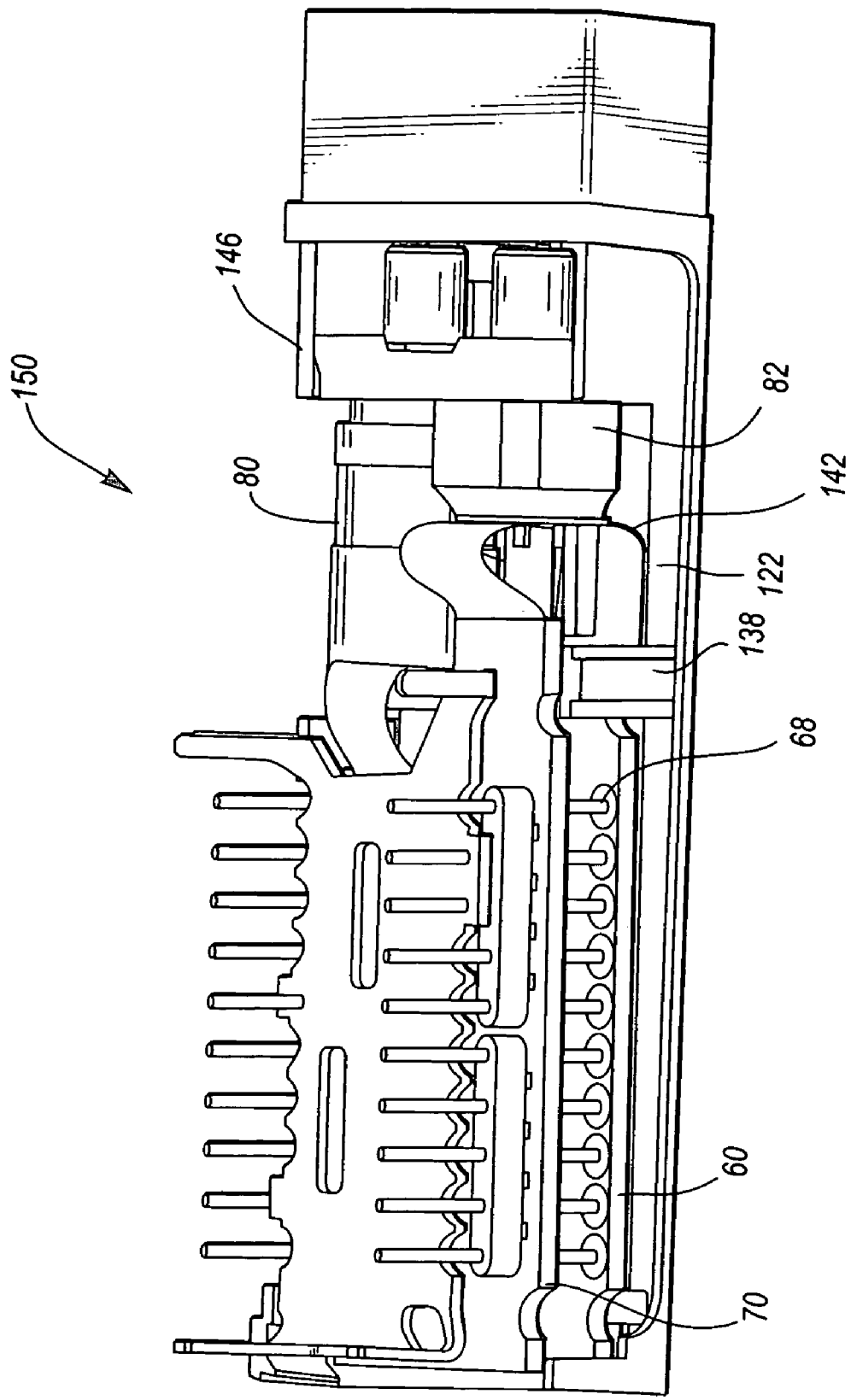
FIG. 12 depicts a partially enclosed transceiver of the first embodiment of the invention including the lower housing of FIG. 11.

FIG. 12 depicts a partially enclosed transceiver module 150, which is the triple-ground-plane transceiver 110 (FIG. 10) placed in the lower housing 120 (FIG. 11). The secondary board 60, which does not lodge on the end wall 132, rests on the rib 142 so that the bottom ends of the connector pins 92 do not contact the chassis ground base 122. The side cutouts 68 accommodate the side structure 138, and the corner cutouts 67 accommodate the corner structures 130 of the lower housing 120. The secondary board 60 would not be able to rest on the rib 142 and be positioned parallel to the base 122 if it were not for the corner cutouts 67, the side cutout 68, and the absence of a counterpart to extension 73.

The primary board 70 rests on the lower corner shelves 134 and the side shelves 136, and therefore do not contact the secondary board 60. The secondary board 60 and the primary board 70 must be separated by a sufficient distance so that components on the primary interior surface 70b and the components on the secondary interior surface 60b do not come into contact. The corner cutouts 77 (see FIG. 6A) accommodate the corner structures 130 and the side cutouts 78 (see FIG. 6A) accommodates the side structure 138. The corner cutouts 77 prevent the primary board 70 from sliding around in the plane of the primary board 70. The side cutouts 78, on the other hand, prevent the primary board 70 from any pivotal or rotational movements. The signal ground plate 100 rests on the headers 94 and the upper corner shelves 135, and the secondary board 60 hangs from the connector pins 92. Thus, by preventing the primary board 70 from sliding around or pivoting/rotating, the secondary board 60 and the signal ground plate 100 are also fixed in place.

Although the cutout portions 67 and the edge between the cutout portions 67 may touch parts of the lower housing 120, the portions that touch the lower housing 120 are "keepout" sections without circuitry or components. Thus, there is no electric coupling between the chassis-ground lower housing 120 and the secondary board 60.

The connector 84 has a cutout portion 85 so that the flexible connector 84 does not contact the side structure 138. The transmitter module 80 and the receiver module 82 rest on the curved support structures 144 (see FIG. 11). In addition, a port retention bar 146 is placed on the transceiver module 80 and the receiver module 82 such that for each module, the semicircular curve of the support structure 142 and the semicircular curve of the port retention bar 146 meet to surround the module, providing stability and preventing radiation from escaping through the transmitter section 126 and the receiver section 128 and interfering with the operation of the host device. The port retention bar 146 is pressed down by an upper portion of the enclosure (shown below in FIG. 13) when the upper portion is added, and acts as an effective means of blocking any radiation leak through the transmitter section 126 and the receiver section 128. The curved portion of the port retention bar 146 that is not visible in FIG. 12 are shaped to fit around the transmitter and receiver modules.

The secondary board 60 and the primary board 70 are stacked so that both boards are in a plane parallel to the base 122. The transceiver module maintains structural integrity when the boards are stacked in the direction in which the connector pins 92 extend because the connector pins 92 extend through through-holes 64, 74 and are soldered thereon. In the embodiment shown, the transmitter module 80 and the receiver module 82 are aligned in a plane that is substantially parallel to both the critical surface 102 and the stacked boards. In order to fit the transmitter module 80 comfortably within the limited volume of the enclosure, the shapes of the secondary board 60 and primary board 70 are altered from the standard rectangular shape through cutouts 69, 79.

Figure 13:
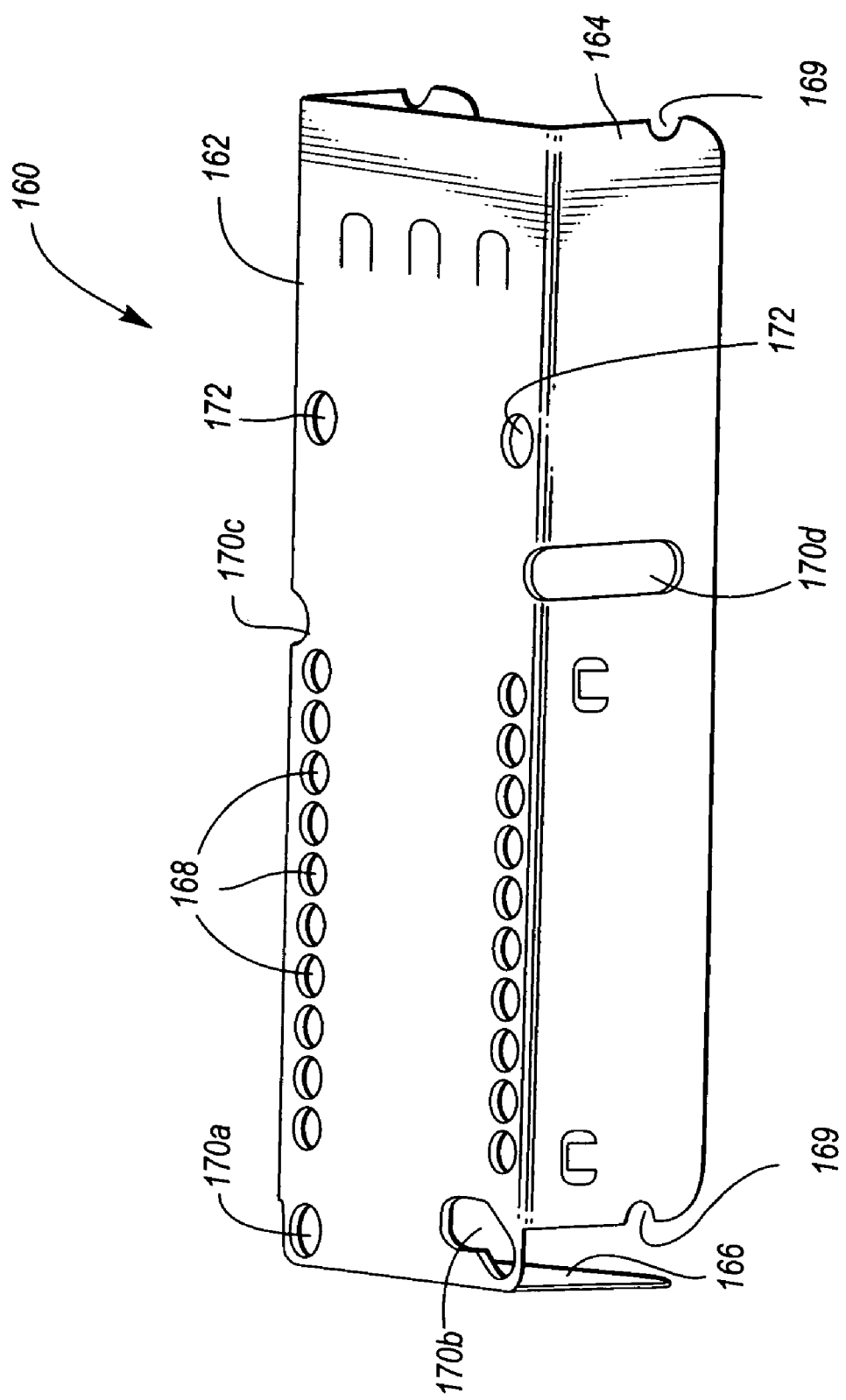
FIG. 13 depicts an upper housing for a transceiver in accordance with the invention.

FIG. 13 depicts an upper housing 160 that is to be combined with the partially enclosed transceiver module 150 shown in FIG. 12 to form a completely enclosed transceiver module. The upper housing 160 includes a critical surface 162, sidewalls 164 that are connected to two opposite edges of the critical surface 162, and an end wall 166 connected to a third edge of the critical surface 162. The critical surface 162 has a connector pin cutout 168 through which the connector pins 92 extend when the upper housing 160 is assembled with the partially enclosed transceiver module 150. Although the connector pin cutout 168 may have different shapes, e.g., two long slits instead of a plurality of holes that each accommodates one connector pin 92, the plurality of holes are preferred because they allow less electromagnetic radiation to escape.

The upper housing 160 also has signal ground pin cutouts 170a, 170b, 170c, and 170d (collectively 170) that accommodate the signal ground pins 108. The signal ground pin cutouts 170a and 170b are shaped to be just large enough for the signal ground pins 108a and 108b to extend through them without touching the edges of the cutouts 170a and 170b. The signal ground pin cutouts 170c and 170d are large enough to accommodate both the support structures 140 and the signal ground pins 108c, 108d. The upper housing 160 is securely coupled with the lower housing 120 when the signal ground pin cutouts 170c, 170d and small side cutouts 169 snap over the support structures 140 and other protrusions on the lower housing 120, respectively. The upper housing 160 touching the side structure 138 or the support structure 140 is not problematic since both the upper housing 160 and the lower housing 120 are chassis ground. A pair of mounting stud openings 172 are located to receive mounting studs. The mounting studs, which are required by the MSA standard, are preferably coupled to the upper housing 160 before the upper housing 160 is combined with the lower housing 120.

Figure 14:
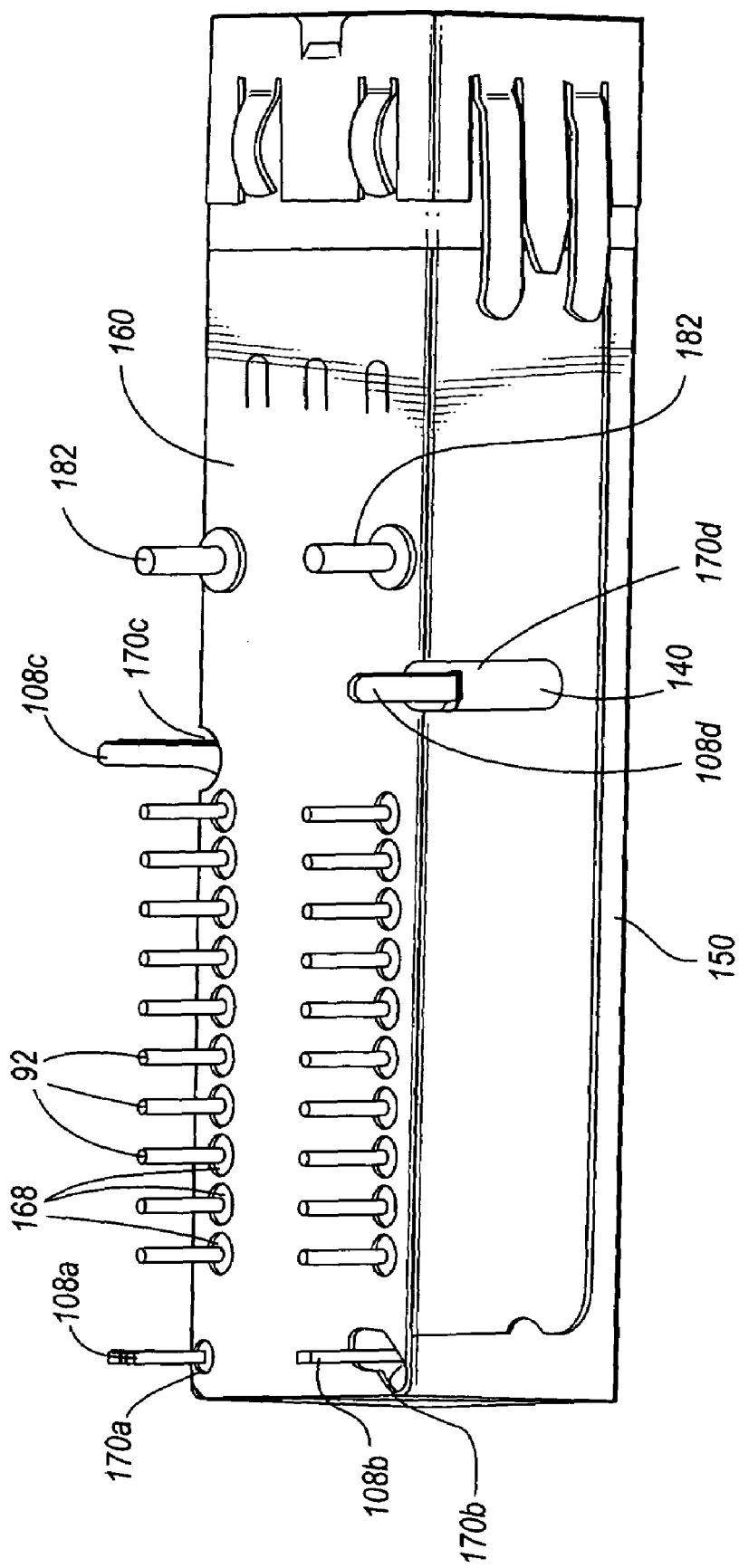
FIG. 14 depicts a completely enclosed transceiver module in accordance with the invention.

FIG. 14 depicts a transceiver module 180, which is the upper housing 160 combined with the partially enclosed transceiver module 150. The connector pins 92 extend through the connector pin holes 168. The signal ground pins 108a and 108b extend through the signal ground pin openings 170a and 170b. The signal ground pins 108c and 108d extend through the signal ground pin openings 170c and 170d along with the support structure 140.

The mounting studs 182 are fixed in place to protrude from the mounting stud openings 172 (see FIG. 13). The mounting studs 182 may be chassis-ground or isolated. If the mounting studs 182 are isolated, mounting stud insulators 184 are necessary to prevent the mounting studs 182 from contacting the chassis-ground upper housing 160. The mounting stud insulators 184 may first be injection molded into the mounting stud openings 172, and then the mounting studs 182 may be pressed into the insulators 184. If insulators 184 are not necessary, the mounting studs 182 may be directly molded into the mounting stud openings 172. The mounting studs 182 being isolated is advantageous in that it allows for customization later according to the needs of the host device. The mounting studs 182 can be chassis-ground if so required by the host device.

FIGS. 15–20 depict a second embodiment of the transceiver that is shown in FIG. 6A–FIG. 14. The main difference between the transceiver of the first embodiment (FIGS. 6A–14) and the transceiver of the second embodiment (FIGS. 15–20) is the arrangement of the transmitter module and the receiver module.

Figure 15:
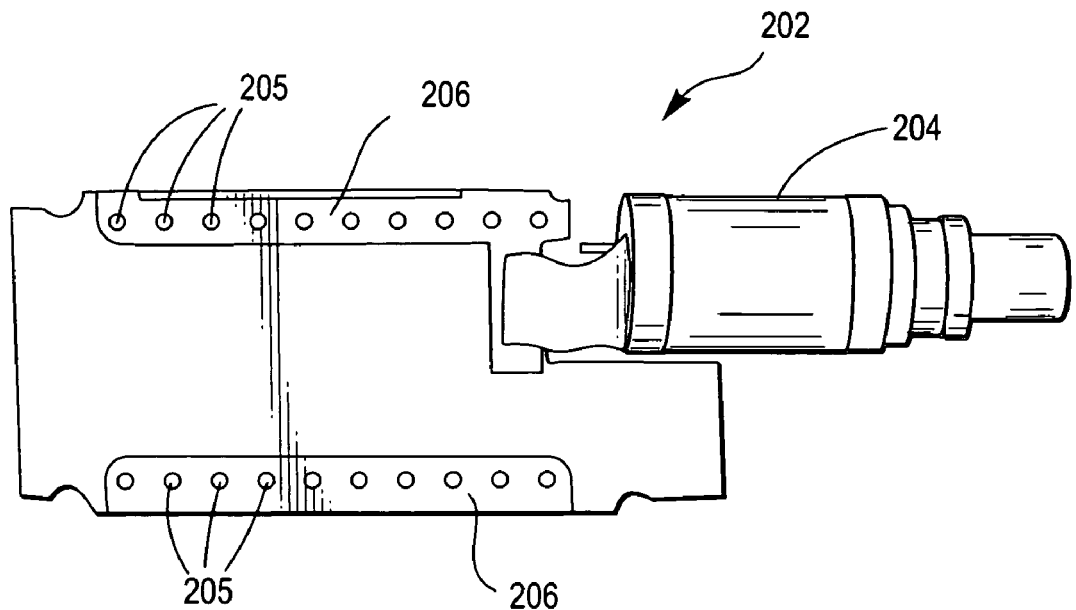
FIG. 15 depicts a primary board coupled to a transmitter module that is to be used for a second embodiment of the invention.

FIG. 15 depicts a primary board 202 coupled to a transmitter module 204. The primary board 202 is a printed circuit board including a ground plane that has circuitry and components on at least one surface. The transmitter module 204 is connected to the primary board 202, a portion of which is cut out to make room for the transmitter module 204. The transmitter module (e.g., TOSA) 204 is a well-known device similar to the transmitter module 80. The primary board 202 has through-holes 205 along two edges, and the two edges are coated with a conductive material to create conductive zones 206. The basic shape of the primary board 202 is similar to that of the primary board 70 (FIG. 6A) with similar cutouts. However, unlike the primary board 70, which is connected to both a transmitter module and a receiver module, the primary board 202 is coupled only to the transmitter module 204.

Figure 16:
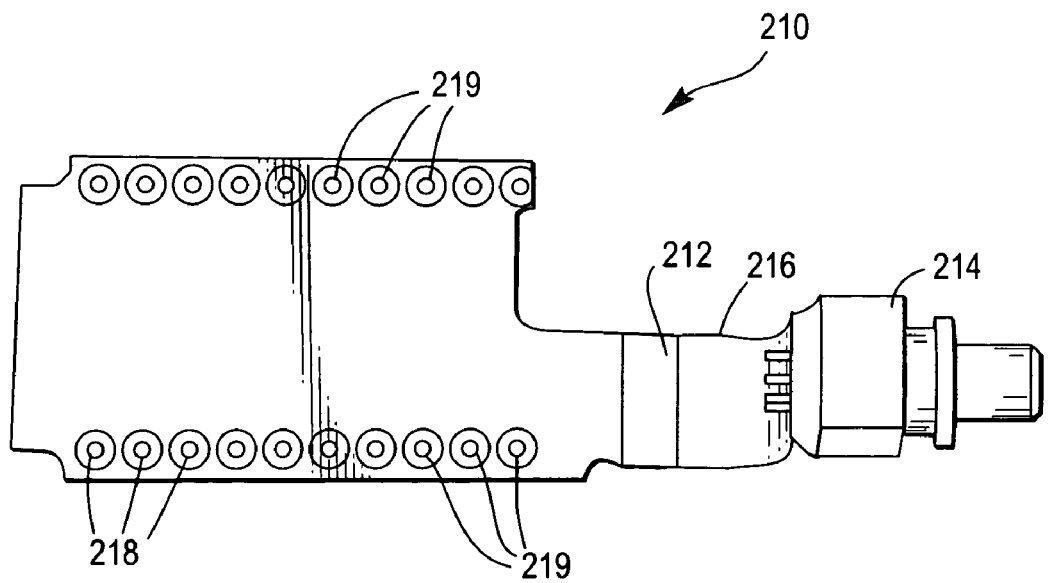
FIG. 16 depicts a secondary board coupled to a receiver module that is to be used for the second embodiment of the invention.

FIG. 16 depicts a secondary board 210. The secondary board 210 is a printed circuit board including a signal ground plane and circuitry on at least one surface, and is generally similar to the secondary board 60 of FIG. 6B except that the secondary board 210 is directly connected to a receiver module 214. The secondary board 210 has a conductive zone 212 that is physically connected to the receiver module (e.g., ROSA) 214, which is a well-known device similar to the receiver module 82 (FIG. 6A). The receiver module 214 may be connected to the conductive zone 212 by any of the conventional methods, and preferably a flexible ribbon connector 216. The secondary board 210 has through-holes 218 along the edges that include electrically conductive sections connected to the circuitry on the secondary board 210.

Figure 17:
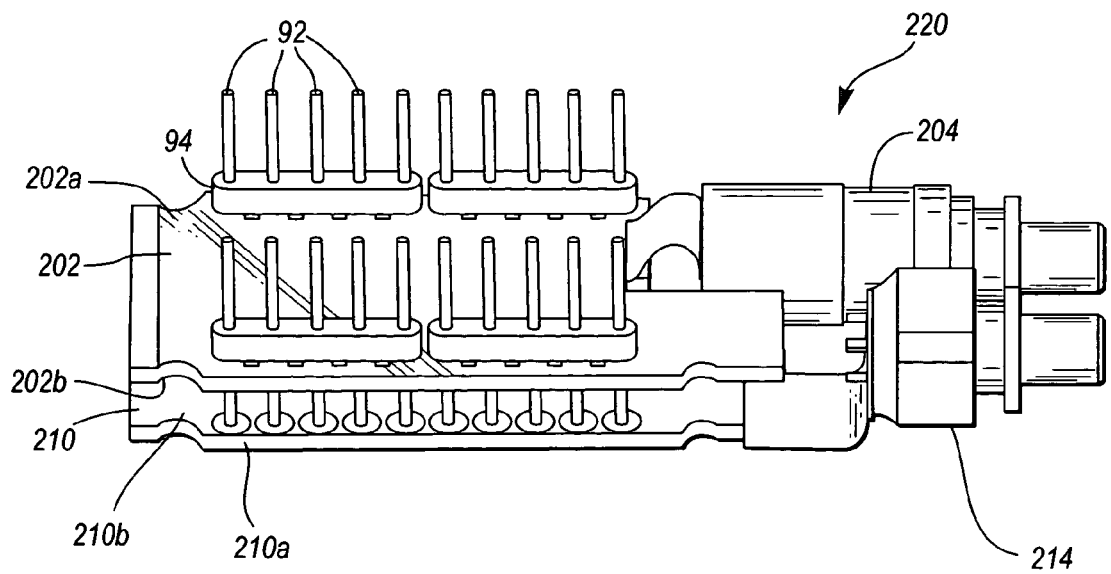
FIG. 17 depicts the primary board and the secondary board coupled with a pin device in accordance with the second embodiment of the invention.

FIG. 17 depicts a transceiver 220 that includes the primary board 202 and the secondary board 210 connected with pin devices 90 (see FIG. 7). The primary board 202 and the secondary board 210 are connected in substantially the same manner as the primary board 70 and the secondary board 60 (see FIG. 8). The lower pin portion (length $L_b$) of the connector pins 92 are inserted through the through-holes 205 of the primary board 202 until the header 94 comes in contact with the primary board 70. The header 94 may be affixed, e.g., with an adhesive, to the primary board 202 by any conventional manner that does not affect the electrical connection between the circuitry on the board and the connector pins 92. Then, the lower portion of the connector pins 92 are inserted through the through-holes 218 of the secondary board 210 and the connector pins 92 are soldered to the through-holes 205, 218. When the connector pins 92 extend through the through-holes 205, 218, they come in contact with the conductive zones 206, 219 near the through-holes. Thus, the connector pins 92 establish an electrical as well as physical connection between the primary board 202 and the secondary board 214.

Once the primary board 202 and the secondary board 210 are assembled in this manner, there are up to four surfaces on which circuitry and components can be placed. These four surfaces are a primary exterior surface 202a, a primary interior surface 202b, a secondary exterior surface 210a, and a secondary interior surface 210b. Since the primary board 202 and the secondary board 210 are connected to one module each, most circuitry relating to the operation of the transmitter module 204 may be placed on the primary board 202, while most circuitry relating to the operation of the receiver module 214 may be placed on the secondary board 210 to minimize undesirable crosstalk between the transmitter components and the receiver components. The noisiest transmitter components may be placed on the primary exterior surface 202a, while the most noise-sensitive receiver components may be placed on the secondary exterior surface 210a. Also, board space may be conserved and transceiver manufacturing cost may be reduced by using only one controller chip for both boards instead of one controller chip for each board. The multi-board configuration of transceiver 220 provides circuit designers with more options by providing more board space that is away from the board periphery. The gap between the primary interior surface 202b and the secondary interior surface 210b not only allow components to comfortably fit on the surfaces, but also allows air flow between the boards. The air flow helps heat dissipation for components attached to board surfaces.

Figure 18:
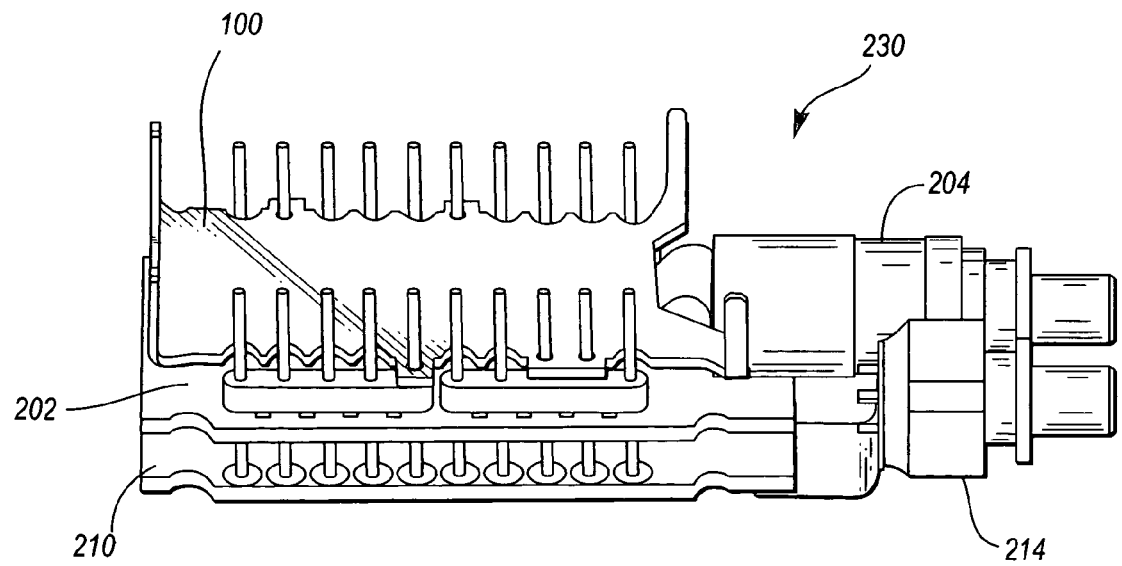
FIG. 18 depicts a tri-ground-plane transceiver including a signal ground plane in accordance with the second embodiment of the invention.

FIG. 18 depicts a tri-ground-plane transceiver 230 that includes the multi-board transceiver 220 combined with the signal ground plane 100 (FIG. 9). The signal ground plane 100 is added to the multi-board transceiver 220 in a substantially similar manner that it is added to the multi-board transceiver 98 (FIG. 8) to form tri-ground-plane transceiver 110 (FIG. 10).

FIG. 19 depicts a method of assembling the tri-ground-plane transceiver 230 with the lower housing 120 (see FIG. 11) to form a partially-enclosed transceiver module 240. As the outline of a transceiver module is dictated by an industry standard, the tri-ground-plane transceiver 110 and the tri-ground-plane transceiver 98 are able to fit into the same housing. The lower housing 120 is chassis ground and made of an RF-shielding material so that the radio frequency emissions from the components on primary board 202 and the secondary board 210 do not interfere with the operation of components outside the transceiver module, and vice versa. The tri-ground-plane transceiver 230 is placed inside the lower housing 120 in substantially the same way the tri-ground-plane transceiver 98 is placed inside the lower housing 120, with the planes of the primary board, the secondary board, and the signal ground plane being parallel to the base 122 and the connector pins 92 extending in a direction orthogonal to these planes. Since the receiver module 214 is coupled to the secondary board 210, which is positioned closer to the base 122, extra caution must be taken to ensure that the connector 216 does not come in contact with the base 122 and especially the rib 142 (see FIG. 11). The connector 216 may be shaped differently from the connector 86 that was used to connect the receiver module to the primary board in FIG. 6A, to avoid coming in contact with the rib 142.

The upper housing 160 of FIG. 13 is added to the partially-enclosed transceiver module 230 to form a transceiver module that looks substantially similar to the transceiver module of FIG. 14. The outlines of the transceiver modules, which is dictated by the industry standard, is the same between the embodiments. Since the connector pins 92 are used to couple the optical transceiver with a host device, the critical surface 162 is the surface of upper housing 210 that is closest to the host device when the optical transceiver module is assembled. The upper housing 160 is designed so that when it is assembled with the lower housing 120, the primary board 202 and the secondary board 210 are completely enclosed except for the connector pins 92 that protrude through the pin openings 168. Preferably, at least some of the connector pins 92 have a straight portion that extends in a direction perpendicular to the planes of the boards 202 and 210 toward to a host device. As a consequence, the base 122 and the critical surface 162 are both perpendicular to the straight portion of the connector pins 92 that couple the transceiver module to the host device. Preferably, the base and the housing surface that is to be attached to the host device are the largest surfaces of a rectangular-shaped module. This way, the surface area of the primary board 202 and the secondary board 210 that is away from the enclosure is maximize.

A person of ordinary skill in the art would understand that the preferred positioning and alignment of the transmitter module and the receiver module are a function of the shapes and sizes of each of these modules and of the size and shape limitations imposed on the transceiver module, and the invention is not limited to the embodiments shown. For example, the transmitter module 62 and the receiver module 64 may be placed in a plane that is perpendicular to the critical surface 102 and the stacked boards.

The multi-board transceiver module of the invention provides the benefit of lowering manufacturing costs by reducing scrap parts. Since components and circuitry are spread out over multiple boards instead of being squeezed into one board, and since the components on each board are tested separately, only one board needs to be scrapped if there is a defective component. The remaining components on the other board can still be used. For example, in the second embodiment where the receiver module and transmitter module are connected to different boards and the receiver module does not pass the quality test, only the board connected to the receiver module needs to be scrapped. This is different from the situation involving single-board configurations where if one part fails the test, all the transceiver components would have to be scrapped.

A person of ordinary skill in the art would understand that various modifications may be made to the multi-board transceiver modules described herein without straying from the scope of the invention. For example, while the transmitter module and the receiver module are shown to be connected to one or more of the boards by flexible ribbon connectors, any well-known method for electrically coupling two parts may be used instead of flexible connectors. Wires may be used. Alternatively, the transmitter module and the receiver module may be directly mounted on their respective boards. Also, the through-holes on the boards are not limited to being holes. The through-holes may be any open or closed aperture or notch.

While the foregoing has been with reference to a particular embodiment of the invention, it will be appreciated by those skilled in the art that changes in this embodiment may be made without departing from the principles and spirit of the invention, the scope of which is defined by the appended claims.

What is claimed is:

1. An optical transceiver module comprising:
    an enclosure;
    a first ground plane disposed within the enclosure, the first ground plane comprising an element of a first printed circuit board disposed within the enclosure;
    a second ground plane disposed within the enclosure, the second ground plane comprising an element of a second printed circuit board disposed within the enclosure, wherein the first printed circuit board and the second printed circuit board are stacked within the enclosure in a spaced-apart arrangement; and
    a transmitter module and a receiver module disposed within the enclosure, wherein the transmitter module is electrically coupled to the first printed circuit board and the receiver module is electrically coupled to the second printed circuit board.

2. The optical transceiver module as recited in claim 1, further comprising:
    a third ground plane disposed within the enclosure, the third ground plane comprising a signal ground plate disposed within the enclosure and electrically coupled with the first printed circuit board and the second printed circuit board.

3. The optical transceiver module as recited in claim 2, wherein the first printed circuit board is positioned between the second printed circuit board and the signal ground plate.

4. The optical transceiver module as recited in claim 2, wherein at least one of the first and second printed circuit boards includes circuitry on two opposing surfaces.

5. The optical transceiver module as recited in claim 2, wherein a portion of the enclosure is electrically isolated from the second printed circuit board.

6. The optical transceiver module as recited in claim 2, wherein the enclosure comprises a chassis ground.

7. The optical transceiver module as recited in claim 2, further comprising a controller chip electrically connected to one of the first and second printed circuit boards, wherein the controller chip controls the transmitter module and the receiver module.

8. The optical transceiver module as recited in claim 2, wherein the signal ground plate contacts a predetermined connector pin so that the predetermined connector pin serves as a signal ground.

9. The optical transceiver module as recited in claim 2, further comprising a pin device having a plurality of pins, at least some of which extend through the enclosure, and wherein:
    the first printed circuit board defines a plurality of conductive through holes that are electrically coupled to each other by a conductive zone that is electrically coupled with circuitry on the second printed circuit board;
    the second printed circuit board defines a plurality of conductive through holes, each of which communicates with circuitry on the second printed circuit board and has a corresponding conductive zone that is spaced apart from conductive zones of the other holes; and
    each of the pins passes through a through hole of the first printed circuit board and a through hole of the second printed circuit board so that circuitry on the first printed circuit board is electrically coupled with circuitry on the second printed circuit board, at least one of the pins further being electrically coupled with the signal ground plate.

10. An optical transceiver module comprising:
    an enclosure;
    a transmitter module and a receiver module disposed inside the enclosure;
    a primary board disposed within the enclosure and providing a first ground plane, wherein the transmitter module is electrically coupled to the primary board;
    a secondary board disposed within the enclosure and providing a second ground plane, the receiver module is electrically coupled to the secondary board; and
    a signal ground plate disposed within the enclosure and providing a third ground plane, the signal ground plate being electrically coupled with the primary board and the secondary board, and the signal ground plate including a plurality of signal ground pins, at least one of which extends through the enclosure; and
    wherein one of the printed circuit boards is located above the other printed circuit board.

11. The optical transceiver module as recited in claim 10, wherein at least one of the primary and secondary boards includes circuitry disposed on opposing surfaces of the at least one of the primary and secondary board.

12. The optical transceiver module as recited in claim 10, wherein the enclosure comprises a chassis ground.

13. The optical transceiver module as recited in claim 10, wherein the signal ground plate contacts a predetermined connector pin so that the predetermined connector pin serves as a signal ground.

14. The optical transceiver module as recited in claim 10, wherein the first and second ground planes are formed integrally with the primary board and the secondary board, respectively.

15. The optical transceiver module as recited in claim 10, further comprising a controller chip electrically connected to one of the primary and secondary boards, wherein the controller chip controls the transmitter module and the receiver module.

16. The optical transceiver module as recited in claim 10, further comprising a pin device having a plurality of pins, at least some of which extend through the enclosure, and wherein:
    the primary board defines a plurality of conductive through holes that are electrically coupled to each other by a conductive zone that is electrically coupled with circuitry on the secondary board;
    the secondary board defines a plurality of conductive through holes, each of which communicates with circuitry on the secondary board and has a corresponding conductive zone that is spaced apart from conductive zones of the other holes; and
    each of the pins passes through a through hole of the primary board and a through hole of the secondary board so that circuitry on the primary board is electrically coupled with circuitry on the secondary board, at least one of the pins further being electrically coupled with the signal ground plate.

17. The optical transceiver module as recited in claim 2, wherein the signal ground plate further comprises a plurality of signal ground pins, at least one of which extends through the enclosure.

* * * * *